United States Patent [19]

Richter

[11] 4,389,115
[45] Jun. 21, 1983

[54] OPTICAL SYSTEM

[76] Inventor: Thomas A. Richter, 711 15th St., Hermosa Beach, Calif. 90254

[21] Appl. No.: 290,435

[22] Filed: Aug. 6, 1981

[51] Int. Cl.³ .................. G03B 27/32; G03B 27/52
[52] U.S. Cl. .................................. 355/26; 350/292; 355/67
[58] Field of Search ............... 355/23, 26, 67; 350/292

[56] References Cited

U.S. PATENT DOCUMENTS

| 3,479,118 | 11/1969 | Paige | 355/26 |
| 3,531,198 | 9/1970 | Delp | 355/26 |
| 3,624,724 | 11/1971 | Sheffer | 355/26 X |
| 3,885,871 | 5/1975 | Galatha et al. | 355/23 |
| 4,195,913 | 4/1980 | Dourte et al. | 350/292 |
| 4,241,392 | 12/1980 | Boone | 355/67 X |
| 4,289,380 | 9/1981 | Tucker | 350/292 |

FOREIGN PATENT DOCUMENTS 2352035 4/1975 Fed. Rep. of Germany ........ 355/26

Primary Examiner—Richard A. Wintercorn
Attorney, Agent, or Firm—Allen A. Dicke, Jr.

[57] ABSTRACT

Optical system provides a uniform, well-collimated beam particularly for the exposure of photoresist on integrated circuit boards. The well-collimated beam is produced in a short beam path through the use of a series of mirrors, including concave mirrors and an integrator mirror to produce reliable exposure characteristics at the exposure focal plane. Preferably, a beam splitter is provided so that the focal plane is illuminated on both sides for concurrent exposure of both sides of the board.

14 Claims, 3 Drawing Figures

# OPTICAL SYSTEM

BACKGROUND

This invention is directed to an optical system which provides well-collimated light of excellent uniformity of intensity so that it is particularly useful for an exposure system and, with a beam splitter, it is useful for concurrent both-side exposure of printed circuit boards or other systems having photosensitive material thereon. As an exposure system, the optical design is useful for either single-sided exposure or double-sided exposure. Furthermore, the characteristics of the beam make the optical system particularly suitable for use as a solar simulator. The optical design provides good collimation even with a short optical path and good uniformity of the intensity of the beam for uniform exposure.

Modern electronic design includes the reduction in physical size of assembly by employing systems of smaller size. Concurrent with this, the interconnection of electronic systems has been made more compact by employing printed circuit boards of continually more compact arrangement. The other arts have improved, including the exposure definition of the photosensitive material, the making of photo-exposure masks of continually finer definition, and the control of the chemical etching procedure itself. In order to take advantage of these advances and to maximize the advantages of these advances in the other arts, advances in the optical exposure of the photosensitive resist must be made. The exposure must be substantially uniform over this exposure area to provide substantially uniform development characteristics. Furthermore, the illumination provided for the exposure must be well-collimated to provide a sharp exposure edge at each edge in the mask.

The exposure system of this invention is designed to satisfy those needs and also to provide for large area exposure and for double-sided exposure for those cases where photosensitive material and masks are provided on both sides of the board. Furthermore, the exposure system is well-suited for being incorporated into an automated system.

SUMMARY OF THE INVENTION

In order to aid in the understanding of this invention, it can be stated in essentially summary form that it is directed to an optical system wherein an optical design provides a substantially collimated, substantially uniform photoresist exposure beam which is provided over a short exposure path. The optical structure includes at least one concave mirror and at least one integrator mirror to provide substantial focus, substantial collimation, and substantial uniformity of intensity.

It is, thus, an object of this invention to provide a substantially collimated, high resolution exposure system particularly useful for providing exposure to printed circuit boards and similar structures. It is a further object of this invention to provide an optical design in an exposure system where the optical path length is quite short, but with substantial collimation, substantial uniformity, and a substantial increase in the exposure intensity over the focal plane at which the exposure is made. It is a further object to provide an exposure system wherein material to be exposed can be readily handled and placed at the focal plane by manual or automated systems so that work can be quickly, easily and accurately exposed.

Other objects and advantages of this invention will become apparent from a study of the following portion of this specification, the claims and the attached drawings.

BRIEF DESCRIPTION OF THE INVENTION

DESCRIPTION OF THE PREFERRED EMBODIMENT

Figure 3:
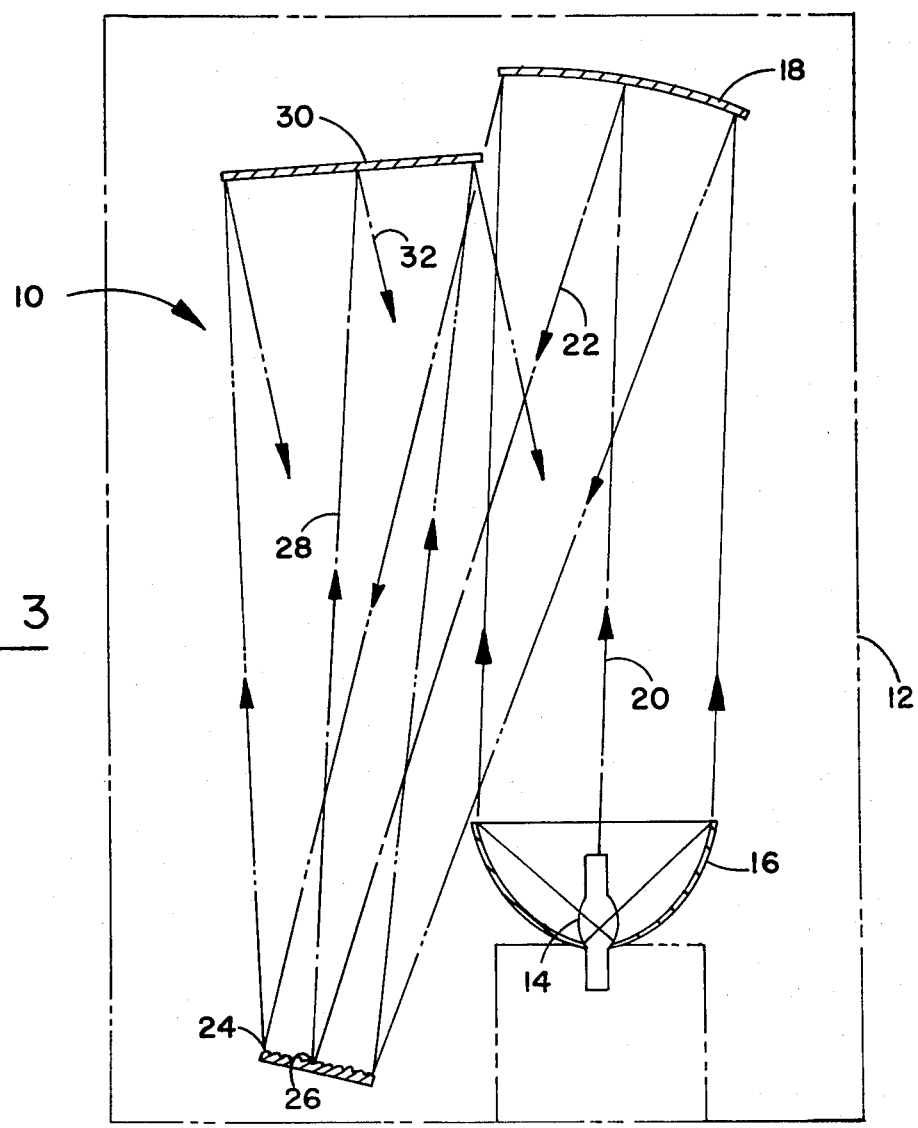
FIG. 3 is a schematic rear-elevational view of a portion of the optics in the optical system, as seen generally along the line 3—3 of FIG. 2.
Figure 2:
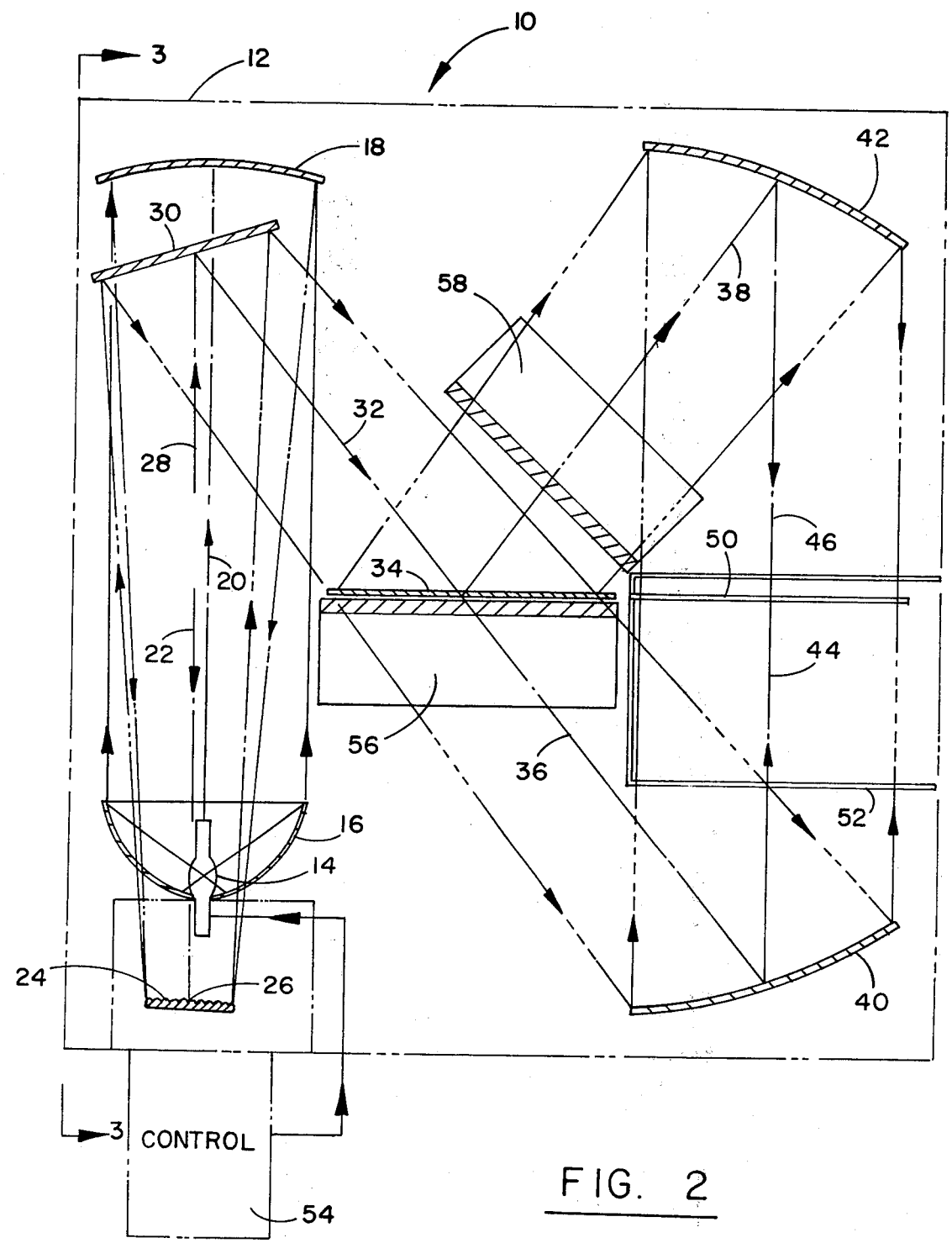
FIG. 2 is a schematic side-elevational view of the optical system, as seen generally along the line 2—2 of FIG. 1.

The exposure system of this invention includes an optical system 10 schematically indicated in FIGS. 2 and 3. The optical system 10 is employed in housing 12 which contains the control equipment for the optical exposure as well as the structure on which the device to be exposed is moved into the focal plane. In view of its compact physical arrangement in housing 12, exposure system 10 is best understood by reference to the two views of FIG. 2.

Light source 14 must be of a high-intensity character in order to provide the required illumination. It is preferably a mercury-xenon arc lamp with a short arc to provide the smallest spot available for focal purposes. The lamp must be vented in order to prevent its overheating, and housing 12 is provided with suitable ducting for air flow across the lamp or light source 14. One specific example is a 5,000-watt mercury-xenon short arc lamp, and with such a lamp, a cooling air flow of about 500 cubic feet per minute is required across the lamp. Parabolic reflector 16 contains lamp 14 at its focal point and directs the lamp output upward to focus mirror 18. Central ray 20 is indicated for this light path. Focus mirror 18 is concave and redirects the optical energy generally downward with central ray 22. The spherical configuration of focus mirror 18 condenses the energy. In the path from parabolic reflector to spherical mirror 18, the optical energy with its central ray 20 comprises substantially parallel or collimated energy in view of the parabolic character of mirror 16. The spherical figure of focus mirror 18 causes the energy beam to converge as it reaches integrator mirror 24 on a path indicated by the central ray 22. The focal point of concave spherical mirror 18 is beyond integrator mirror 24, and thus the optical energy bundle is of smaller diameter at integrator mirror 24.

Integrator mirror 24 is of special construction. In integrator mirror is illustrated in D. D. Dourte, et al., U.S. Pat. No. 4,195,913, the entire disclosure of which is incorporated herein by this reference. The Dourte mirror has a plurality of facets, and each of the facets is optically configured to deliver radiation over the entire object field. In the Dourte construction, each facet is individually optically formed and secured in place. The integrator mirror 24 in the present optical system is functionally similar but structurally different. Integrator mirror 24 has a plurality of reflecting facets 26, each of which is configured to optically deliver the beam over the the entire object area, in this case, the focal plane at the top surface of glass tray 50. Each of the facets 26 is convex to expand the individual beam from each of the facets to the collimation mirrors 40 and 42 which have the same size as the focal plane.

Considering just one reflecting surface 26 of one facet or one body of integrator mirror 24, the central ray 28 reflected from the spherical convex facet 26 on the central body is directed towards mirror 30. In the present structure, the mirror 30 is a flat mirror which redirects the central ray to the path of central ray 32.

Figure 1:
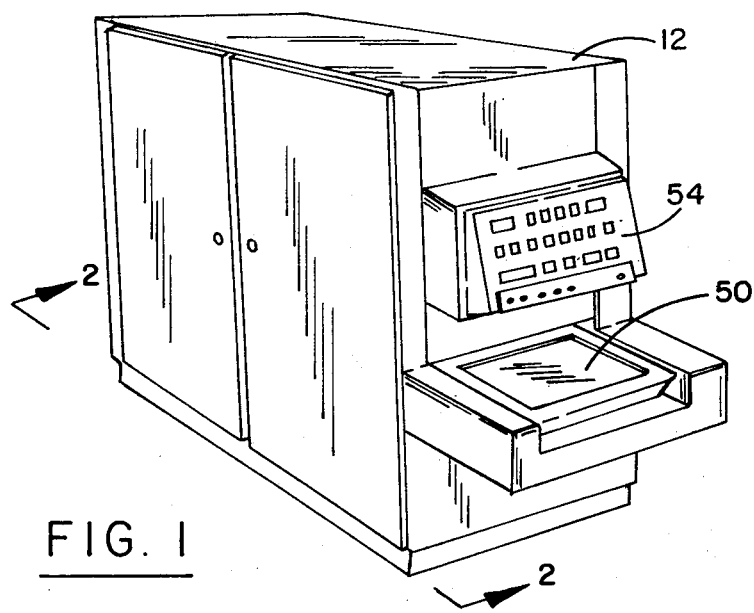
FIG. 1 is a perspective view of the exposure system of this invention, showing the exterior of the housing.

Beam splitter 34 is positioned on the beam containing central ray 32. Beam splitter 34 is planar and is dielectrically coated to transmit half the optical energy through the beam splitter 34 in a beam which contains central ray 36 and to reflect half of the energy in the beam on an upwardly directed path which contains central ray 38. Both beams are still diverging as a result of the convex configuration of the facets of integrator mirror 24. The beams are then respectively reflected upwardly by concave collimation mirror 40 and downwardly by concave collimation mirror 42. These mirrors are concave spherical mirrors of such focal length so that the beams respectively directed up and down, and respectively including central rays 44 and 46, are well-collimated, that is, the individual rays therein are substantially parallel. The focal lengths of the mirrors 40 and 42 are the same and are correlated with the divergency of the beams to those mirrors so that the output beams are parallel. Furthermore, the beams are directed at the top and bottom of focal plane 48, which is equidistant between the collimation mirrors 40 and 42. The top surface of glass tray 50, see FIG. 1, is on the focal plane. Glass tray 50 receives the material to be exposed and slides from the inactive position of FIG. 1 where the sensitive material is placed on the tray to an active position at the focal plane indicated in FIG. 2. Drawer structure 52 is provided to move the tray 50 from the inactive position of FIG. 1 to the active position of FIG. 2.

The description of integrator mirror 24 includes the description of individual facets on this mirror. The description of the central ray 28 reflected from facet 26 includes the spreading of the beam from that facet to full size at mirrors 40 and 42 and the focus of the beam from that facet in collimated condition onto the focal plane. The complexity of the facet 26 thus provides the beam divergence to the mirrors 40 and 42. Each of the other facets of integrator mirror 24 is similarly shaped, and each is directed so that its central ray respectively impinges upon collimation mirrors 40 and 42 at the same point as the impingement of central rays 36 and 38, in the theoretically accurate condition. The optically correct shape of each of the facets 26 of the integrator mirror 24 is computer-determined. Additionally, the orientation of each facet is determined by the same computer program so that the desired result is achieved. After computer determination, one master mirror is produced. For production, additional mirrors are replicated from it. Electro-forming the copies is a suitable present-day replication method. In this way, when more than one such optical system is to be manufactured, costs can be reduced. The integrator mirror 24 in the optical system of this invention achieves both collimation and uniform intensity of illumination across the focal plane.

Lamp 14 is positioned within reflector 16 in a way that the arc in the lamp can be adjusted to the focal point of the reflector for maximum collimation. In these lamps, the illumination point does not substantially change, and thus, adjustment is required only once for each lamp. Thus, adjustment of the lamp can be manually achieved.

Control system 54 is connected to lamp 14 to cut off the lamp when ventilation fails, as a safety precaution. In addition, control system 54 is connected to shutters 56 and 58 which are respectively positioned in the lower and upper beam of illumination output from beam splitter 34. In some cases, exposure from only one side of the sensitive material is desired. In that case, the other shutter may remain closed. In addition, the length of the exposure is controlled by the open duration of shutters 56 and 58. The photosensitivity information with respect to the material to be exposed is considered in establishing the exposure duration. The shutters are positioned so that they each cut off only one of the upper or lower exposure beams for individual control thereof. The shutters are preferably hinged or pivoted plate shutters to permit them to cover the entire beam area.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. An optical system comprising:
    a light source, a reflector positioned with respect to said light source to direct a substantial amount of light from said light source along a beam path;
    a plurality of optical elements positioned along said beam path, said optical elements comprising an integrator mirror having a plurality of facets and at least two curved mirrors, said beam path terminating at a focal plane, said optical elements being configured so that light arriving at said focal plane from said lamp is substantially collimated and is substantially uniformly distributed over said focal plane.

2. The optical system of claim 1 further including means for positioning a photosensitive material to be exposed substantially on said focal plane.

3. The optical system of claim 1 wherein said facets on said integrator mirror are each individually directed and said facets are curved so that the beam from said integrator mirror is uncollimated, said optical system including a curved mirror between said integrator mirror and said focal plane so that the uncollimated beam from said integrator mirror is collimated by said curved mirror.

4. The optical system of claim 3 wherein said integrator mirror is of smaller dimension transverse to the beam path than said lamp reflector and there is a concave mirror positioned on the beam path between said lamp and said integrator mirror to bring the beam towards a focus towards such integrator mirror.

5. An optical system comprising:
    a light source, a reflector positioned with respect to said light source to direct a substantial amount of light from said light source along a beam path;
    a plurality of optical elements positioned along said beam path, said optical elements comprising an integrator mirror having a plurality of facets and at least two curved mirrors, said optical elements further comprising a beam splitter positioned on said beam path to divide the illumination beam into first and second beams passing along first and second beam paths, which both terminate at a focal plane, first and second mirrors positioned opposite said focal plane and on said first and second beam paths to direct both said first and second beams towards said focal plane, said optical elements being configured so that light arriving at said focal plane from said lamp is substantially collimated and is substantially uniformly distributed over said focal plane.

6. The optical system of claim 3 further including a shutter on said beam path and means for controlling said shutter so that illumination to said focal plane can be controlled by said shutter.

7. The optical system of claim 4 wherein said integrator mirror is of smaller dimension transverse to the beam path than said lamp reflector and there is a concave mirror positioned on the beam path between said lamp and said integrator mirror to bring the beam towards a focus towards such integrator mirror.

8. An optical system comprising:
a lamp to provide a source of illumination;
a reflector positioned adjacent said lamp to direct light from said lamp substantially along a beam path, said beam path terminating at a focal plane;
a plurality of optical elements along said beam path between said reflector and said focal plane, said optical elements acting to direct the beam to provide illumination substantially uniformly distributed over said focal plane, said optical elements including at least one integrator mirror having a plurality of facets, each of said facets being substantially optically identical and each of said facets being independently adjustable for controlling the distribution of illumination on said focal plane.

9. The optical system of claim 8 wherein said optical elements include a first mirror positioned between said reflector and said integrator mirror.

10. The optical system of claim 9 wherein said first mirror is a concave mirror to reduce the transverse beam dimension at said integrator mirror.

11. The optical system of claim 9 wherein said integrator mirror is convex and further including a concave second mirror positioned between said integrator mirror and said focal plane for substantially collimating the beam between said second mirror and said focal plane.

12. The optical system of claim 11 wherein said second mirror is a first collimation mirror and is positioned on one side of said focal plane and there is a second collimation mirror positioned on the other side of said focal plane, a beam splitter positioned on the beam path so that the beam extends to both of said collimation mirrors and thence to both sides of said focal plane.

13. The optical system of claim 12 wherein a first shutter is positioned between said beam splitter and said first collimation mirror and a second shutter is positioned between said beam splitter and said second collimation mirror so that said beams to said focal plane can be individually obscured by closing of at least one of said shutters.

14. The optical system of claim 12 wherein a tray is positioned to retain adjacent said focal plane an object to be exposed.

* * * * *